(12) United States Patent
Campini et al.

(10) Patent No.: US 7,336,505 B2
(45) Date of Patent: Feb. 26, 2008

(54) DEPLOYABLE FACEPLATE LABEL SURFACE

(75) Inventors: Edoardo Campini, Mesa, AZ (US);
Steven DeNies, East Aurora, NY (US);
William Handley, Chandler, AZ (US);
Lawson Guthrie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 11/092,292

(22) Filed: Mar. 29, 2005

(65) Prior Publication Data

US 2006/0221589 A1    Oct. 5, 2006

(51) Int. Cl.
*H02B 1/01* (2006.01)
(52) U.S. Cl. ............... 361/825; 361/748; 361/752; 40/299.01; 40/649
(58) Field of Classification Search ......... 361/752, 361/790, 797, 800, 679, 748, 796, 784; 40/299, 40/649; 439/152, 159, 160; 211/41
See application file for complete search history.

(56) References Cited

U.S. PATENT DOCUMENTS

| | | | | |
|---|---|---|---|---|
| 3,681,665 A | * | 8/1972 | Olds et al. | 361/681 |
| 5,790,278 A | * | 8/1998 | Ehrne et al. | 358/496 |
| 5,984,688 A | * | 11/1999 | Norris | 439/64 |
| 6,723,915 B2 | * | 4/2004 | Radu et al. | 174/359 |
| 2003/0235042 A1 | * | 12/2003 | Harris et al. | 361/752 |
| 2006/0123021 A1 | * | 6/2006 | Byers | 707/100 |

OTHER PUBLICATIONS

Advanced TCA, PICMG 3.0 Short Form Specification, PCI Industrial Computers Manufacturers Group (PICMG), (Jan. 2003),33 pages.
AMC PICMG AMC.0, Advanced Mezzanine Card Short Form Specification, Version D0.9a,(Jun. 15, 2004),57 pages.

* cited by examiner

*Primary Examiner*—Tuan T. Dinh
*Assistant Examiner*—Hung S Bui
(74) *Attorney, Agent, or Firm*—Grossman, Tucker, Perreault & Pfleger, PLLC

(57) ABSTRACT

A method according to one embodiment may include providing circuit board having a faceplate. The method of this embodiment may also include providing a label surface capable of moving between a deployed position and a stowed position. When the label surface is in a deployed position at least a portion of the label surface extends outwardly from the faceplate relative to the circuit board. Of course, many alternatives, variations, and modifications are possible without departing from this embodiment.

17 Claims, 6 Drawing Sheets

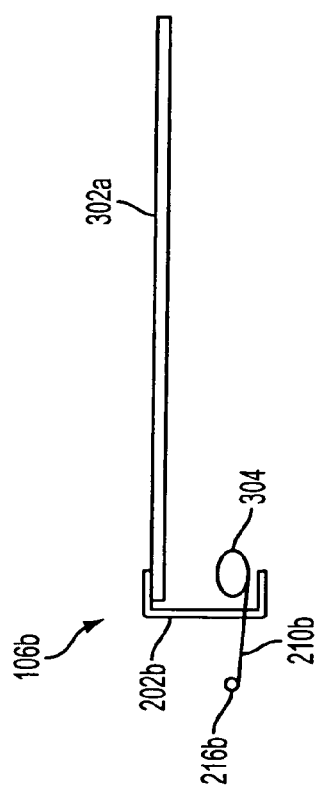
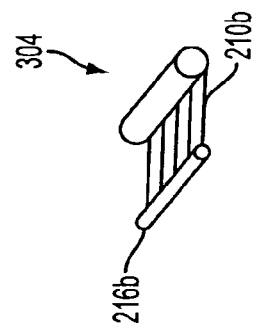

DEPLOYABLE FACEPLATE LABEL SURFACE

FIELD

The present disclosure relates to information displays for circuit boards, cards, and the like.

BACKGROUND

In computer systems, circuit boards, cards, and various modules may be installed in such a manner that the only exposed portion of the circuit boards, cars, or modules is a front faceplate. The surface area of the faceplate may be dictated by the relevant technical specifications for the circuit board, card, module, etc. Additionally, practical limitations may be placed on the surface area of the faceplate, for example based chassis density, space usage, etc. Because it may be the only exposed portion of the circuit board, card, or module, space usage on the faceplate is often an important consideration. For example, connection portions for external components or equipment may be provided on the faceplate to allow access and connection while the circuit board, card, or module is in use or operating. Similarly, status indicators, including displays, LED's, etc. may be provided on the faceplate to enable the indicators to be monitored or viewed during operation of the circuit board, card, or module.

In addition to features such as connectors, status display indicators, etc., which may be involved in the operation, use, or maintenance of the circuit board, card, or module, it may also be desirable to provide a circuit board, card, or module with other information. For example, information such as directions warnings, etc., which may be important to the use or operation of the circuit board, card, or module, may desirably be included on the circuit board, card, module, etc. Additionally, less operation critical information, such as logos, model or specification designators, advertising information, may be desirably included.

Restrictions on available faceplate surface area, or real estate, may often limit the amount of information which may be included on the faceplate. The amount of information which may be included on the faceplate may be further limited by the need for features such as connectors, indicators, etc. Accordingly, there may not be enough room on the faceplate to include such less critical information. In some instances, there may not even be sufficient room on the faceplate to include some critical information. In cases in which there is insufficient room on the faceplate for all of the desired information, such additional information may be printed on, or provided on a label affixed to, a side surface, etc., of the circuit board, card, module, etc. In such situations, the additional information may not be viewable, readable, etc. during normal operation of the circuit board, card, module, etc.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 4 is a schematic side view of another embodiment of a card including a deployable label surface consistent with the present disclosure;

FIG. 5 is a perspective view of the embodiment of a card including a deployable label surface depicted in FIG. 4;

FIG. 6 is an embodiment of a deployable label surface arrangement consistent with the present disclosure;

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
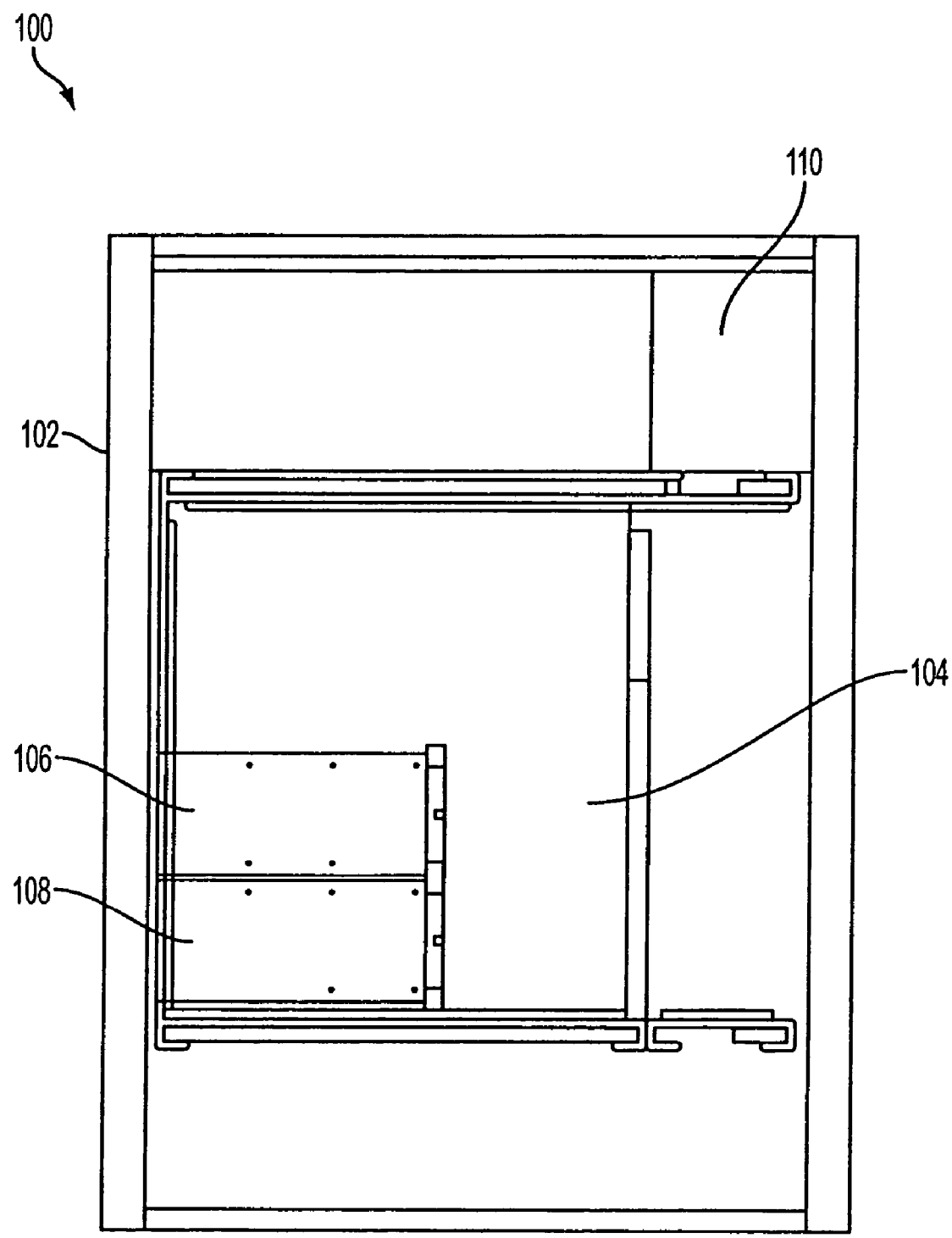
FIG. 1 schematically depicts an embodiment of a system consistent with the present disclosure.

Referring to FIG. 1, an embodiment of a system consistent with the present disclosure is shown. The system 100 may generally include a chassis 102 having at least one, or more, circuit boards 104 at least partially disposed within the chassis 102. The circuit board 104 may be mechanically and/or electrically coupled to the chassis 102 and/or one or more components and/or features disposed within the chassis 102. One, or more, modules and/or circuit boards, such as cards 106, 108, may be mechanically and/or electrically coupled to the circuit board 104. The cards 106, 108 may include various components such as processors, memory, hard drives, etc. The system 100 may further include one or more fans 110 capable of producing an airflow through the chassis 102, which may assist cooling circuit boards 104, cards 106, 108, etc. at least partially housed within the chassis 102.

According to one embodiment, the chassis 102 may be an advanced telecommunications computing architecture (advanced TCA or ATCA) chassis complying with, and/or compatible with, PCI Industrial Computer Manufacturers Group (PICMG), rev. 3.0, Advanced Telecommunications Computing Architecture (ATCA), published Dec. 30, 2002 (the ATCA Specification). In such an embodiment, the printed circuit board 104 may be an ATCA board, or blade, complying with, and/or compatible with, the ATCA Specification. A chassis and/or a circuit board consistent with the present disclosure may additionally and/or alternatively have various alternative form factors and/or may be compatible with, and/or comply with, various other technical specifications.

Consistent with an embodiment herein, the one or more cards 106, 108 coupled to the circuit board 104 may be removable and/or replaceable modules. In an embodiment herein, the one or more cards 106, 108 may be an Advanced Mezzanine Card (AMC) complying with and/or compatible with PCI Industrial Computer Manufacturers Group (PICMG), Advanced Mezzanine Card (AMC) Base Specification, PICMG AMC.0, published Jan. 3, 2005 (the "AMC Specification"). A card consistent with the present disclosure may be configured according to various additional and/or alternative form factors and/or may comply with and/or be compatible with various additional and/or alternative technical specifications.

Figure 2:
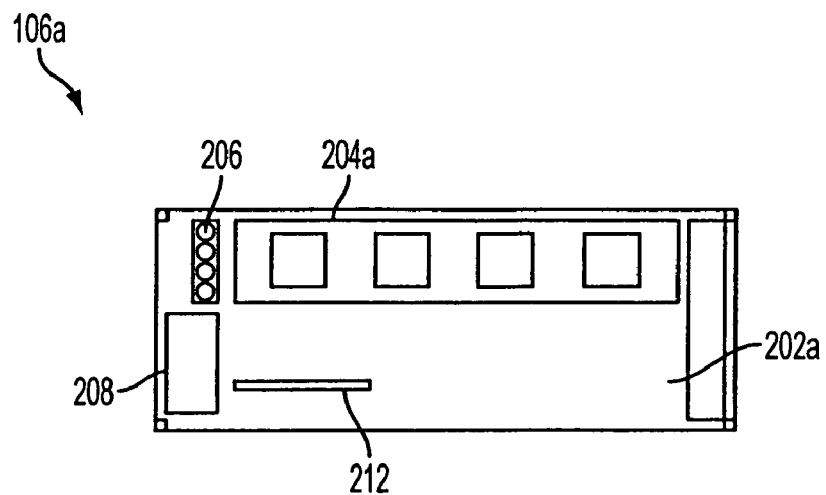
FIG. 2 illustrates an embodiment of a card faceplate including a label consistent with the present disclosure in a stowed position.
Figure 3:
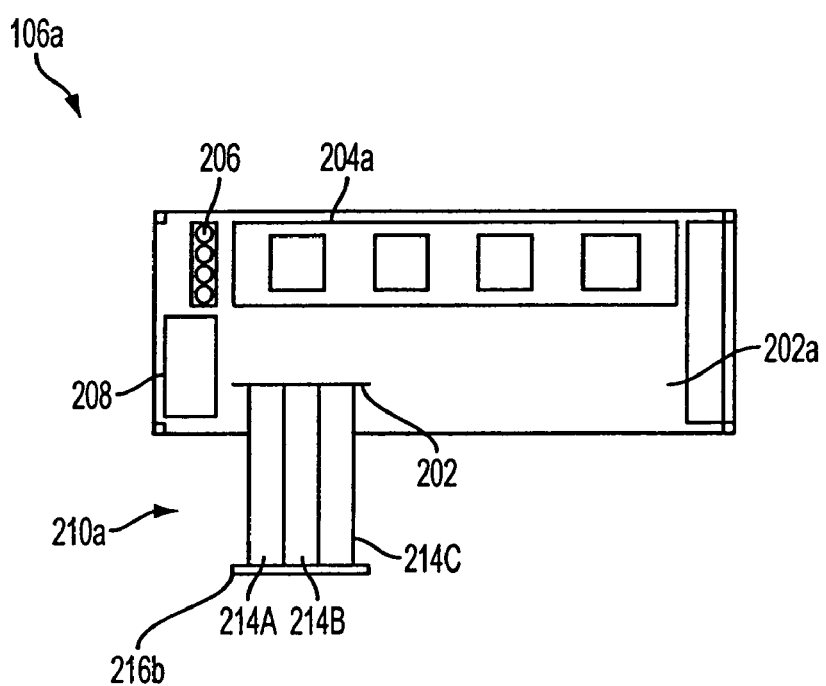
FIG. 3 illustrates an embodiment of a card faceplate including a label surface consistent with the present disclosure in a deployed position.

Turning to FIGS. 2 and 3, and embodiment of a card 106a consistent with the present disclosure is depicted. As shown, the card 106a may include a faceplate 202a including various features. For example, as shown the face plate of the card 106a may include connectors 204a, which may allow the card 106a to be coupled to various other systems, components, modules etc. Additionally, the faceplate 202a of the card 106a may include indicators 206, such as LED, etc., which may provide indications of the status of the card 106a, operation of various features, state of connectivity, failure indication, etc. The faceplate 202a may also include features such as form factor identification 208. In addition to supporting various features, the faceplate 202a of the card 106a may provide shielding against electromagnetic interference/radio frequency interference (EMI/RFI). Cards complying with, and/or compatible with the AMC Specification, and/or complying with and/or compatible with technical specifications in addition to, or in the alternative to, the AMC Specification, may include different and/or additional features on a faceplate thereof.

Turning to FIG. 3, the card 106a may further include a label surface 210a that may be deployable through an opening 212a in the faceplate 202a of the card 106a. The label surface 210a may be provided as a generally planar member that may support and/or carry and/or display various types of information. For example, the label surface 210a may include directions, notices, warnings, etc. relating to the use, operation, maintenance of the card 106a and/or of related and/or associated components. Furthermore, the label surface 210a may include other information. As used herein, information may include text, diagrams, pictures, indicia, etc. that may be visually perceivable and/or machine readable, such as barcodes, magnetic data strips, etc.

In various embodiments consistent with the present disclosure the information may be provided on the label surface 210a in a variety of manners and/or by a variety of processes or techniques. For example, graphical information may be printed directly on the label surface. Any suitable printing technique, such as inkjet printing, masking, silk screening, etc. may be employed without limitation. According to a further embodiment, the information may be provided on a substrate, such as by printing, masking, etc. the information onto the substrate. The substrate may then be applied to the label surface. In one embodiment, a substrate including information may be applied to the label surface using an adhesive, such as a pressure sensitive adhesive. In this manner, the information may be applied to the label surface in the form of a sticker or adhesive label.

As shown in FIGS. 2 and 3, the opening 212a may be provided as a slit in the faceplate 202a of the card 106a, and the label surface 210a may be at least partially slidably deployable through the opening 212a. The label surface 210a may be moved to a deployed position by sliding the label surface 210a outwardly from the faceplate 202a. The label surface 210a may further be slidably movable inwardly through the opening 212a to a stowed position. Accordingly, the label surface 210a may be pulled outwardly from the faceplate 202a such that the information may be viewed and/or perceived. When viewing and/or perceiving of the information is not necessary and/or desired, the label surface 210a may be pushed inwardly through the opening 212a to a stowed position. In a stowed position at least a portion of the label surface 210a may be disposed behind the faceplate 202a.

As mentioned above, in a stowed position at least a portion of the label surface 210a may extend behind the faceplate 202a of the card 106a. In a deployed position, at least a portion of the label surface 210a may also be disposed behind the faceplate 202. Accordingly, in a deployed and/or in a stowed position at least a portion of the label surface 210a may be in contact with and/or in close proximity to electrical components and/or conductive pathways on and/or associated with electrical circuitry of the card 106a. In an embodiment herein the label surface 210a may be formed from a non-conducting material and/or may be provided having a non-conductive surface treatment. Forming the label surface 210a from a non-conductive material and/or having a non-conductive surface treatment may reduce the occurrence of short-circuiting, sparking, etc. that may be caused by a conductive member coming into contact with electrical components and/or conductive pathways of the card 106a.

In an embodiment herein, the label surface 210a may be provided having sufficient tensile strength, in a longitudinal direction, to allow the label surface 210a to be pulled outwardly from the faceplate 202a to a deployed position. Additionally, the label surface 210a may be provided having sufficient rigidity to allow the label surface 210a to be pushed longitudinally inwardly at least partially through the opening 212a. In one embodiment consistent with the foregoing, the label surface may be provided as a flexible material and including one or more longitudinal stiffening members. Accordingly, even if the flexible material is not sufficiently rigid to allow it to be pushed inwardly to a deployed position, the one or more longitudinal stiffening members may allow the label surface, as a whole to be sufficiently rigid to allow the label surface to be pushed inwardly at least partially through the opening. In an embodiment including longitudinal stiffening members, the label surface may be a composite structure including a flexible material and stiffening members. Alternatively, longitudinal stiffness may be provided by patterns, and/or longitudinal regions, of increased cross-sectional thickness, etc.

According to one aspect, the label surface 210a may be deployed from the card 106a while the card 106a is installed in and/or coupled to a circuit board, which may itself be installed in and/or coupled to a chassis and/or housing, etc. Accordingly, the label surface 210a may allow the information carried and/or supported thereon to be read, viewed, perceived, etc., without removing and/or uninstalling the card 106a from the circuit board, chassis, etc. Additionally, in an embodiment herein, the information carried and/or supported on the label surface may be read, viewed, and/or perceived without powering down the card. As such, the information on the label surface may be read, viewed, and/or perceived during normal operation of the card and/or without interrupting operation of the card.

According to a further aspect, a card 106a may be provided having a label surface 210a deployable from the faceplate 202a of the card 106a without compromising the EMI/RFI shielding characteristics of the faceplate 202a. In an embodiment, the opening 212a may be provided as a slotted slit. In such a configuration, the opening may be provided as a plurality of slots in a linear arrangement on the faceplate 202a. In such an embodiment, the label surface 210a may include a plurality of strips 214A-C. One or more of the strips 214A-C may extend through each of the slots making up the opening 212a. In some cases, a slotted slit, as described, may reduce and/or minimize EMI/RFI exposure, as compared to a single slit providing a generally equivalent opening surface area.

The label surface 210a may include a transverse member 216a at and/or adjacent to an end of the label surface 210a. The transverse member 216a may prevent the label surface 210a from being inserted all of the way through the opening 212a. The transverse member 216a may be provided having any desired or convenient configuration without particular limitation as to size, geometry, etc. A second transverse member may be associated with a portion of the label surface disposed behind the faceplate. As shown, in an embodiment in which the label surface 210a includes a plurality of strips 214A-C, the individual strips 214A-C may be connected at a front edge by the transverse member 216a.

According to another embodiment, the label surface may be biased toward the stowed position, in which at least a portion of the label surface is disposed behind the faceplate. Referring to FIGS. 4 through 6, another embodiment of a card 106b is depicted. The card 106b may generally include a circuit board 302a having a faceplate 202b coupled to one end of the circuit board 302a. The card 106b may further include a retractable label surface 210b. As with the previous embodiment, the label surface 210b may provide a surface and/or substrate for carrying and/or supporting various forms of information. Also similar to the previous embodiment, the label surface 210b may be deployed through an opening in the faceplate 202b.

In the embodiment depicted in FIGS. 4 through 6, the label surface 210b may be biased toward a stowed position. As shown, the label surface 210b may be coupled to a reel or roller assembly 304. The roller assembly 304 may be disposed at least partially behind the faceplate 202b of the card 106b. Similar to the previously described embodiment, the label surface 210b may include a transverse member 216b. As shown, the transverse member 216b may remain generally on an outward side of the faceplate 210b.

In a stowed position at least a portion of the label surface 210b may be capable of being wrapped or wound around the roller 304. The label surface 210b may be deployed by unwrapping or unwinding at least a portion of the label surface 210b from the roller assembly 304. According to an embodiment, the roller assembly 304 may be rotatable about the axis thereof. The roller assembly 304 may be capable of being rotated in a first, stowing, direction causing at least a portion of the label surface 210b to wrap or wind around the roller assembly 304. The roller assembly 304 may also be capable of being rotated in a second, deploying, direction causing at least a portion of the label surface 210b to unwrap or unwind from around the roller assembly 304. The label surface 210b may be formed of a material having sufficient flexibility to be capable of being wrapped and/or unwrapped from around the roller assembly 304.

As previously mentioned, the label surface 210b may be biased toward a stowed position. In one such embodiment, the roller assembly 304 may be a retractable reel or roller. Such a roller assembly 304 may be rotationally biased in a first, stowing, direction, capable of wrapping and/or winding the label surface 210b around the roller assembly 304. The label surface 210b may be deployed from the roller assembly 304 by pulling the label surface 210b, e.g., by the transverse member 216b, outwardly from the roller assembly 304. Pulling the label surface 210b outwardly from the roller assembly 304 may be capable of causing the roller assembly 304 to rotate in a second, deploying, direction capable of unwrapping and/or unwinding the label surface 210b from the roller assembly 304. When the force pulling the label surface 210b outwardly from the roller assembly 304 is released, the biasing force on the roller assembly 304 may be capable of urging the roller assembly 304 to rotate in a first, stowing, direction, causing at least a portion of the label surface 210b to wrap or wind around the roller assembly 304. According to a further embodiment, deploying the label surface by pulling the label surface outwardly from the roller assembly may bias the roller assembly toward the first, stowing, direction, and/or may increase the bias of the roller assembly toward the first, stowing, direction. Various biasing elements, such as torsion springs, clock springs, elastic members, etc. may be employed in connection with the roller assembly and/or the label surface to bias the label surface toward a stowed position.

According to one aspect, providing a label surface stowable on a roller assembly may reduce the depth behind the faceplate necessary to accommodate the label surface. This aspect may be convenient in connection with cards having tall components extending from the circuit board which components may minimize the depth of clearance available behind the faceplate. Providing the label surface stowable on a roller assembly may also reduce the occurrence of the label surface contacting components and/or conductive pathways, etc. of the card when the label surface is in a stowed position and/or is moved between a deployed and a stowed position. In some instances this aspect may reduce the potential of damage to the components and/or conductive pathways, etc. of the card and/or may reduce the potential of damage to the label surface.

In an embodiment of a label surface biased toward a stowed position, the label surface may include a plurality of individual strips. As previously described, the plurality of individual strips making up the label surface may be deployed through an opening configured as a slotted slit. Such a slotted slit may include a plurality of individual slots that may be provided in a linear array. The plurality of individual strips may be coupled at one end, e.g., by a transverse member. The individual strips may further be oriented generally parallel to one another, thereby collectively providing a surface having a discontinuous nature. The foregoing slotted slit arrangement may reduce EMI/FRI interference through the opening. According to an alternative embodiment, the label surface may be provided as a single strip of material and the opening may include a continuous slit.

According to another aspect, the label surface may be a generally planar member, as depicted with reference to FIGS. 2 and 3 that may be biased toward a stowed position without the use of a roller assembly. According to one such embodiment, a biasing element may be coupled to a portion of the label surface disposed behind the faceplate. The biasing element may bias the label surface toward the stowed position. In one particular embodiment, an expansion spring, such as a coil spring, may be coupled to an end and/or portion of the label surface disposed behind the faceplate. The expansion spring may also be coupled to a feature and/or structure of the card. When the label surface is pulled outwardly from the faceplate, deploying the label surface and allowing any graphical information on the label surface to be viewed and/or perceived, the expansion spring may be stretched. When the force pulling the label surface outwardly from the faceplate is released, the stretched expansion spring may tend to recover to an un-stretched position. As the spring moves to an un-stretched position the spring may pull the label surface inwardly behind the faceplate toward a stowed position. Various biasing elements, such as an elastic element, may be used as an alternative to, or in addition to, an expansion spring. Additionally, variations on the foregoing arrangement may also suitably be employed.

Figure 7:
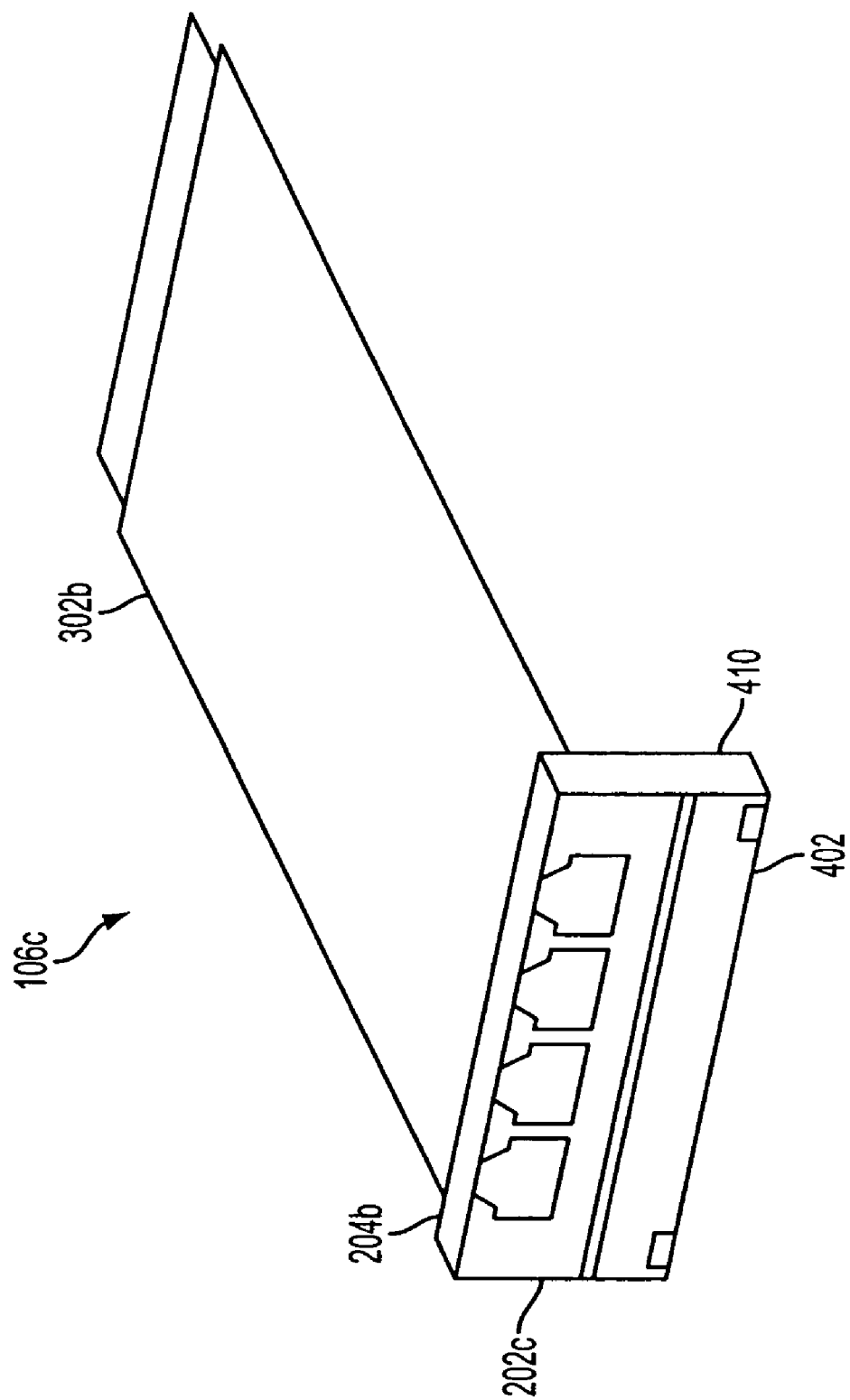
FIG. 7 depicts an embodiment of a card including a label surface in a stowed position consistent with the present disclosure.
Figure 8:
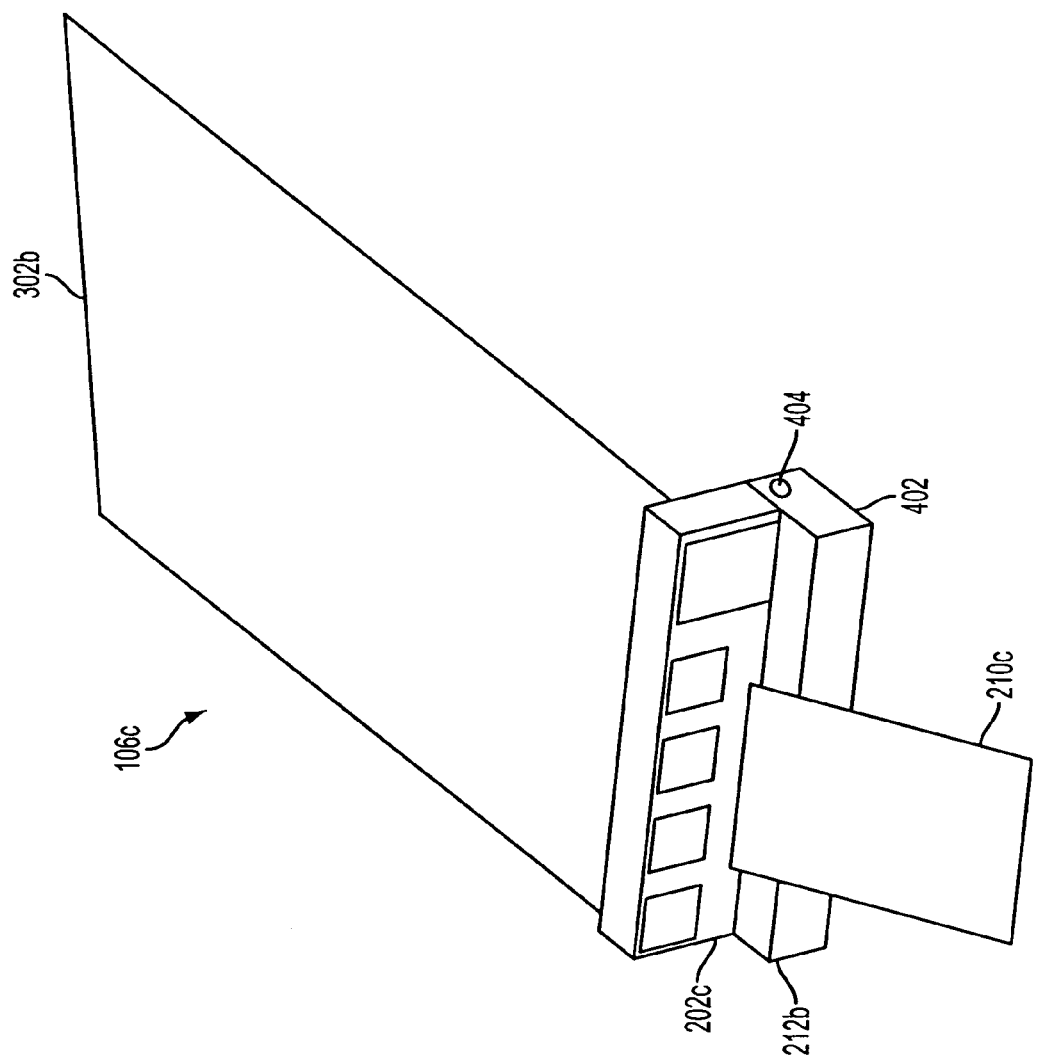
FIG. 8 depicts the card of FIG. 7 including a label surface in an deployed position.

Referring next to FIGS. 7 and 8, yet another embodiment of a card 106c including a stowable/deployable label surface 210c is depicted. As with the preceding embodiments, the card 106c may include a circuit board 302b coupled to a faceplate 202c. As with previous embodiments, the faceplate 202c may include various features, such as connectors 204b, indicator lights, etc. The card 106c may further include a label surface 210c which may be capable of being deployed from the faceplate 202c. The label surface 210c may also be capable of being stowed at least partially behind the faceplate 202c. According to various alternatives, the label surface may be movable between the deployed and the stowed positions consistent with any description herein. As such, the label surface may be freely movable between the deployed and stowed potions and/or may be biased toward the stowed position.

Consistent with the embodiment depicted in FIGS. 7 and 8, the opening 212b may be provided as a single continuous slit. In such an embodiment, the label surface 210c may be provided as a single member. The illustrated label surface 210c may provide a continuous surface. EMI/RFI exposure through the opening 212b may be reduce and/or controlled by at least partially covering the slit, for example, when the label surface 210c is in a stowed position. In one embodiment, EMI/RFI exposure through the opening 212b may be at least partially obstructed by providing a cover 402 that is movable between an opened position and a closed position. Referring to the drawings, the cover 402 may be placed in a closed position when the label surface 210c is in a stowed position, as shown in FIG. 7. The cover 402 may be moved to an opened position, as shown in FIG. 8, to expose the opening 212b. When the cover 402 is in an opened position and the opening 212b is exposed, the label surface 210c may be moved to a deployed position in a manner described herein.

In the illustrated embodiment, the cover 402 may be provided as a member capable of overlying at least a portion of the faceplate 202c including the opening 212b. As shown, the cover 402 may be pivotally movable between the opened position and the closed position. For example, one or more hinge pins 404 may pivotally couple the cover 402 to the card 106c. In other embodiments, the cover may be slidably movable between an opened position and a closed position. Furthermore, an embodiment contemplated herein may include a cover that is movable between an opened position and a closed position by at least partially removing and/or detaching the cover from the card and/or from the faceplate of the card. According to various alternative embodiments, the cover may overlie only a portion of the faceplate surrounding the perimeter of the opening.

In still a further embodiment, the opening may include a continuous slit. EMI/RFI exposure may be reduced by providing a transverse member of an EMI/RFI shielding material coupled to the label surface. When the label surface is in a stowed position the EMI/RFI shielding transverse member may at least partially obscure the opening to EMI/RFI. Consistent with the foregoing, an EMI/RFI shielding transverse member may at least partially overlie the opening when the label surface is in a stowed position. In further embodiments, an EMI/RFI shielding transverse member may be at least partially received in the opening, thereby at least partially plugging the opening with an EMI/RFI shielding material. Various combinations and various configurations of EMI/FRI shielding and/or reduction may be employed in connection with label surface systems herein.

Figure 9:
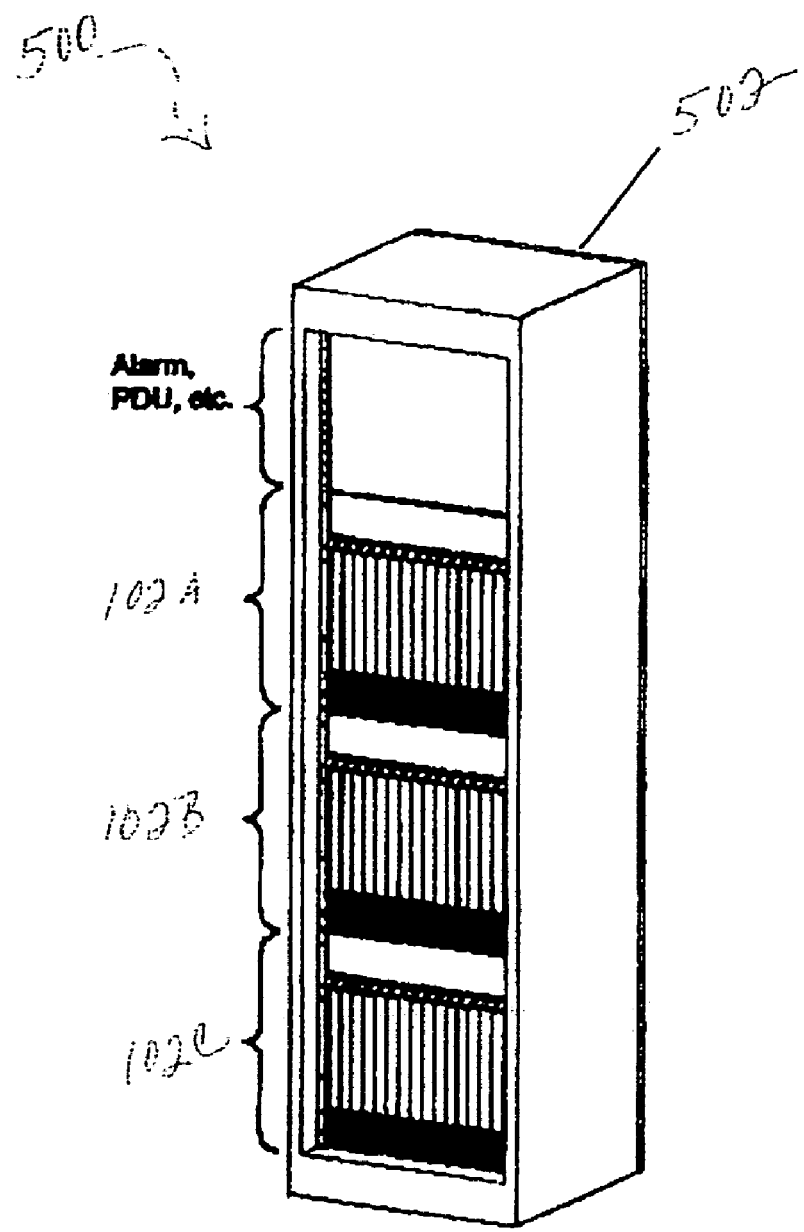
FIG. 9 depicts an embodiment of a frame that may suitably be employed in connection with the present disclosure.

Referring to FIG. 9, a system 500 consistent with the present disclosure is illustrated. As depicted, the system 500 may include a frame 502. The frame 502 may accommodate and electrically couple a plurality of chassis 102A, 102B, 102C. On or more of the chassis 102A, 102B, 102C may include at least one circuit board which may be coupled to at least one card including a label surface consistent with any embodiment disclosed herein. The frame 502 may include, for example, a power supply for providing power to each of the individual chassis 102A, 102B, 102C disposed in the frame 502, etc. Additionally, as mentioned above, the frame 502 may electrically couple one or more of the chassis 102A, 102B, 102C to at least one other chassis.

According to an alternative embodiment, rather than being disposed in a common frame, a system consistent with the present disclosure may include a plurality of chassis that may be individually hardwired to one another. One or more of the plurality of chassis may include at least one circuit board coupled to at least one card consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Various embodiments herein have been depicted and described in the context of a card that may be coupled to and/or associated with a circuit board or blade. The features and aspects of such embodiments are readily susceptible to use in application other than cards. For example, a surface for carrying, providing, and/or supporting information may be employed in connection with a circuit board, such as an advanced telecommunications computing architecture blade, which may be at least partially received in a chassis. Similarly, a surface for carrying, providing, and/or supporting information may also be employed in connection with a module and/or a component, such as a hard drive, storage module etc. Accordingly, the scope of the disclosure should not be limited to the context provided for the purpose of description. Furthermore, various embodiments have been described including various attributes, features, and aspects. The attributes, features, and aspects of the various embodiments are readily combinable with one another and/or are subject to modification and various within the scope of the present disclosure.

Consistent with the foregoing, an arrangement providing a surface for carrying and/or supporting and/or presenting information, identification, etc. is provided. The surface may include any variety of graphical and/or machine readable information including, but not limited to, text, pictorial representations, illustrations, barcodes, optical/magnetic/magneto-optical presented information, etc. According to one aspect, the surface is movable between a deployed position in which the information can be viewed, read, and/or perceived. The surface may be associated with a faceplate of a card, a circuit board, a module, etc. Accordingly, information may be provided which is readable, viewable, and/or perceivable from a front faceplate of a card, circuit board, module, etc. during normal operation, for example, without removing the card, circuit board, module, etc. from a carrier, chassis, etc. with which the card, circuit board, module, etc. is associated and/or without powering down the card, circuit board, module, etc. Additionally, a surface according to the present disclosure may require a relatively small amount of surface area of the faceplate to provide the information.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
   a frame;
   a chassis at least partially disposed in said frame;
   a circuit board comprising a faceplate; and
   a label surface movable between a deployed position and a stowed position, at least a portion of said label surface extending outwardly from said faceplate, relative to said circuit board, in said deployed position; wherein said label surface is movable between said deployed position and said stowed position through an opening in said faceplate.

2. The system according to claim 1, wherein said circuit board comprises an advanced telecommunications computing architecture blade.

3. The system according to claim 1, wherein said circuit board comprises a card coupled to a second circuit board, said second circuit board at least partially disposed within said chassis.

4. The system according to claim 3, wherein said card comprises an advanced mezzanine card.

5. The system according to claim 1, wherein said label surface comprises a generally planar member.

6. The system according to claim 1, further comprising a roller assembly, said label surface being at least partially wrapped around said roller assembly in a stowed position.

7. An apparatus comprising:
   a circuit board comprising a faceplate; and
   a label surface movable between a deployed position and a stowed position, at least a portion of said label surface extending outwardly from said faceplate, relative to said circuit board, in said deployed position; wherein said label surface is movable between said deployed position and said stowed position through an opening in said faceplate.

8. The apparatus according to claim 7, wherein said circuit board comprises an advanced telecommunications computing architecture circuit board.

9. The apparatus according to claim 7, wherein said circuit board comprises an advanced mezzanine card.

10. The apparatus according to claim 7, wherein said opening comprises a plurality of slits.

11. An apparatus according to claim 10, wherein said label surface comprises a plurality of longitudinal strips, at least one of said strips received through one of said plurality of slits.

12. The apparatus according to claim 7, further comprising a cover at least partially obstructing EMI/RFI exposure through said opening.

13. The apparatus according to claim 7, wherein said label surface comprises a rigid member.

14. The apparatus according to claim 7, wherein said label surface is biased toward said stowed position.

15. The apparatus according claim 14, further comprising a roller assembly, at least a portion of said label surface being wrapped around said roller assembly in a stowed configuration.

16. The apparatus according to claim 15, wherein said roller assembly is rotationally biased toward said stowed position.

17. A method comprising:
    providing a circuit board comprising a faceplate;
    providing a label surface capable of moving between a deployed position and a stowed position, at least a portion of said label surface extending outwardly from said faceplate, relative to said circuit board, in said deployed position; and further comprising providing a biasing element coupled to said label surface, said biasing element biasing said label surface toward a stowed position.

* * * * *